(12) United States Patent
Anderson

(10) Patent No.: US 9,002,278 B2
(45) Date of Patent: Apr. 7, 2015

(54) SIMPLE AUTOMATIC ANTENNA TUNING SYSTEM AND METHOD

(75) Inventor: William David Anderson, Chapel Hill, NC (US)

(73) Assignee: HTC Corporation, Taoyuan (TW)

( * ) Notice: Subject to any disclaimer, the term of this patent is extended or adjusted under 35 U.S.C. 154(b) by 230 days.

(21) Appl. No.: 13/408,719

(22) Filed: Feb. 29, 2012

(65) Prior Publication Data

US 2013/0225088 A1 Aug. 29, 2013

(51) Int. Cl.
| | |
|---|---|
| H04B 15/00 | (2006.01) |
| H04B 17/00 | (2006.01) |
| H04B 1/18 | (2006.01) |
| H04B 1/04 | (2006.01) |
| H03H 7/40 | (2006.01) |

(52) U.S. Cl.
CPC ............... H04B 1/18 (2013.01); H04B 17/00 (2013.01); H04B 1/0458 (2013.01); H04B 17/0007 (2013.01); H03H 7/40 (2013.01)

(58) Field of Classification Search
CPC .... H04B 1/0458; H04B 17/0007; H04B 1/18; H04B 17/00; H03H 7/40
USPC ............. 455/62, 73, 82, 553.1, 276.1, 80, 88, 455/575.5, 550.1, 77, 192.2, 83; 343/700 MS, 767, 372, 860
See application file for complete search history.

(56) References Cited

U.S. PATENT DOCUMENTS 6,961,368 B2 * 11/2005 Dent et al. ................. 375/219
7,190,933 B2 * 3/2007 De Ruijter et al. ........... 455/125
7,693,495 B2 4/2010 Itkin et al.

(Continued)

FOREIGN PATENT DOCUMENTS

CN 1795605 A 6/2006
CN 101061639 A 10/2007

(Continued)

OTHER PUBLICATIONS

Al-Mously, Salah I., & Abousetta, Marai M., User's Hand Effect on TIS of Different GSM900/1800 Mobile Phone Models Using FDTD Method, World Academy of Science, Engineering & Technology 49 2009; pp. 878-883.

(Continued)

Primary Examiner — Marceau Milord
(74) Attorney, Agent, or Firm — Andrews Kurth LLP; Scott Bloebaum

(57) ABSTRACT

Embodiments of a method for tuning the resonant frequency of an antenna in a wireless communication device are disclosed, along with embodiments of a wireless communication device using such a method. Embodiments sense the out-of-band impedance of the antenna, which comprises an antenna element and selectively adjustable impedance disposed between the antenna element and a ground plane of the wireless device, and adjust the selectively adjustable impedance to achieve a desired resonant frequency of the antenna. Embodiments separate an antenna signal into an in-band signal and out-of-band impedance, generate an error signal related to the out-of-band impedance, apply the error signal to a controller circuit configurable to generate an impedance error signal representing the change in antenna impedance, and apply the impedance error signal to the selectively adjustable impedance. Embodiments of a method and electronic circuit for determining the change in impedance of an antenna are also disclosed.

26 Claims, 10 Drawing Sheets

(56) References Cited

U.S. PATENT DOCUMENTS

| | | | |
|---|---|---|---|
| 7,756,486 B1* | 7/2010 | Tan et al. | 455/73 |
| 7,917,096 B2* | 3/2011 | Wilcox | 455/80 |
| 8,000,737 B2* | 8/2011 | Caimi et al. | 455/550.1 |
| 8,072,285 B2* | 12/2011 | Spears et al. | 333/17.3 |
| 8,111,111 B2* | 2/2012 | Van Bezooijen | 333/17.3 |
| 8,131,232 B2* | 3/2012 | Muhammad | 455/114.2 |
| 8,161,528 B2* | 4/2012 | Crilly, Jr. | 726/3 |
| 8,164,528 B2* | 4/2012 | Brown | 343/728 |
| 8,320,850 B1* | 11/2012 | Khlat | 455/107 |
| 8,339,328 B2* | 12/2012 | Narasimhan et al. | 343/876 |
| 8,351,874 B2* | 1/2013 | Dent et al. | 455/107 |
| 8,351,978 B2* | 1/2013 | Tasic et al. | 455/550.1 |
| 8,391,806 B2* | 3/2013 | Muhammad | 455/107 |
| 8,421,548 B2* | 4/2013 | Spears et al. | 333/17.3 |
| 8,442,451 B1* | 5/2013 | Tan et al. | 455/73 |
| 8,463,218 B2* | 6/2013 | McKinzie et al. | 455/248.1 |
| 8,476,986 B2* | 7/2013 | van Bezooijen | 333/17.3 |
| 8,571,511 B2* | 10/2013 | Goldfarb | 455/323 |
| 8,583,065 B2* | 11/2013 | Ben-Bassat | 455/197.3 |
| 8,620,236 B2* | 12/2013 | Manssen et al. | 455/121 |
| 8,620,247 B2* | 12/2013 | McKinzie et al. | 455/248.1 |
| 8,626,083 B2* | 1/2014 | Greene et al. | 455/77 |
| 8,680,934 B2* | 3/2014 | McKinzie, III | 333/17.3 |
| 2009/0286569 A1* | 11/2009 | Rousu et al. | 455/553.1 |
| 2009/0302968 A1 | 12/2009 | Van Bezooijen | |
| 2011/0002080 A1 | 1/2011 | Ranta | |
| 2013/0052967 A1* | 2/2013 | Black et al. | 455/77 |

FOREIGN PATENT DOCUMENTS

| | | |
|---|---|---|
| CN | 102118175 A | 7/2011 |
| CN | 1941639 B | 11/2011 |

OTHER PUBLICATIONS

Qiao, Dongjiang, Choi, David, Zhao, Yu, et al; Real-Time Adaptation to Antenna Impedance Mismatch for CDMA Transceivers; Univ. of Ca.—San Diego & Nokia Research Center; undated; 16 pgs.

Berg, Markus, Methods for Antenna Frequency Control and User Effect Compensation in Mobile Terminals, ACTA Universitatis Ouluensis, C Technica 410; Dec. 2011; 86 pgs.

Bezooijen, Andre' Van, De Jongh, Maurice A., et al, A GSM/EDGE/WCDMA Adaptive Series-LC Matching Network Using RF-MEMS Switches, IEEE Journal of Solid-State Circuits, vol. 43, No. 10, Oct. 2008, pp. 2259-2268.

Komulainen, Mikko, Berg, Markus, et al, A Frequency Tuning Method for a Planar Inverted-F Antenna, IEEE Transactions on Antennas & Propagation, vol. 56 No. 4, Apr. 2008, pp. 944-950.

Kivekas, Outi, Ollikainen, Jani, et al, Frequency-Tunable Internal Antenna for Mobile Phones, 12th In'l Symposium on Antennas (JINA 2002) vol. 2, Nov. 2002, pp. 53-56.

Myllymaki, S., Huttunen, A., Palukuru, et al, Capacitive Recognition of the User's Hand Grip Position in Mobile Handsets, Progress in Electromagnetics Research B, vol. 22, 2010, pp. 203-220.

Qiao, Dongjiang, Choi, David, Zhao, Yu, et al,, Antenna Impedance Mismatch Measurement and Correction for Adaptive CDMA Transceivers, 2005 IEEE MTT-S International, Jun. 2005, pp. 783-786.

Ranta, Tero, Novak, Rodd, Antenna Tuning Approach Aids Cellular Handsets, Design Feature, Nov. 2008, pp. 82-92.

* cited by examiner

SIMPLE AUTOMATIC ANTENNA TUNING SYSTEM AND METHOD

TECHNICAL FIELD

The technical field is related to improving the performance of antennas used in handheld wireless communication devices.

BACKGROUND

The trend toward integrating an ever-increasing number of communication standards into wireless communication devices such as cellular telephones (also commonly known as "mobile phones" or "handsets") has created a need for integrated antennas operating in many distinct frequency bands. This need is exacerbated by a concurrent a trend toward highly integrated devices that are slimmer, smaller, and lighter than those in prior use. However, the design of the antenna is limited by fundamental relationships between size, bandwidth, and efficiency. Ability to use multiple antennas may also be limited due to the same constraints and also the potential for harmful coupling between the multiple antennas, The design challenge of using a single antenna while maintaining small size and high efficiency is made even more difficult by the fact that the device is used in a variety of configurations and positions by users who manipulate the device and, in particular, the antenna, in ways that are difficult to predict. Moreover, even in a particular user position of the hand and/or head in proximity to the device, the antenna performance will vary greatly according to the location of the antenna within the device. While a nominal antenna provides an input impedance of 50 ohms, in actual usage the impedance at the antenna terminal can vary over a wide range, characterized by a voltage standing wave ratio (VSWR) of up to 10:1. It is a major challenge to maintain operation of the device with such a wide range of impedances, both in transmit and receive modes. In receive mode, the non-optimal source impedance may degrade noise figure, gain and dynamic range of the receiver. In transmit mode, the impedance mismatch may impact the efficiency, power gain, maximum output power and linearity of the transmit power amplifier. In the worst case, the high standing wave amplitude or possible oscillation caused by the mismatch in the circuit may damage the power amplifier.

One solution for mitigating these performance effects is to use a tunable impedance matching network to counteract the change in antenna impedance caused by the user interaction. Some tunable impedance matching networks have been implemented using MEMS switches, variable inductors ("varactors"), thin-film barium strontium titanate (BST) tunable capacitors, and silicon-on-sapphire (SOS) switches. Typically, these networks are placed between the antenna feed point and the radio-frequency transmitter and/or receiver circuits in the wireless device. This placement complicates the process of compensating for the user proximity to the antenna because it turns it into a two-dimensional problem requiring a more complicated matching network, such as with multiple adjustable components.

In addition to the tunable impedance matching network, implementations of such solutions may also require a way of determining that the antenna impedance (or, equivalently, the antenna resonant frequency) has changed. In some cases, this is accomplished by using a directional coupler and radio-frequency detectors. In some implementations, in addition to high complexity, another significant drawback with this approach is that it works during transmit mode and not during receive mode, which means that it cannot be used to mitigate the effects of user proximity to the antenna in important receive-only communication applications such as Global Positioning System (GPS).

Accordingly, benefits can be obtained by a system and method for mitigating the effects of user proximity on antenna performance that will work in both transmit and receive modes of operation and utilizes a simplified antenna impedance matching network.

DESCRIPTION OF THE DRAWINGS

The detailed description will refer to the following drawings, wherein like numerals refer to like elements, and wherein.

DETAILED DESCRIPTION

Embodiments of a method and electronic circuit for determining the change in impedance of an antenna in a wireless communication device are disclosed. Embodiments of the method and electronic circuit separate an antenna signal into an in-band antenna signal and an out-of-band antenna impedance, generate an error signal related to a characteristic of the out-of-band antenna impedance, and apply the error signal to a controller circuit configurable to generate a signal representing the change in impedance of the antenna. In some embodiments the antenna signal originates from a source outside of the wireless communication device, such as a Global Positioning System (GPS) satellite, while in other embodiments the antenna signal comprises a portion of a signal applied to the antenna by a transmitter of the wireless communication device.

Embodiments of a method for tuning the resonant frequency of an antenna in a wireless communication device are also disclosed, along with embodiments of a wireless communication device using such a method. Embodiments of the method and wireless communication device sense the out-of-band impedance of the antenna, which comprises an antenna element and a selectively adjustable impedance disposed between the antenna element and a ground plane of the wireless device, and adjust the selectively adjustable impedance to achieve a desired resonant frequency of the antenna. Moreover, some embodiments separate an antenna signal into an in-band antenna signal and an out-of-band antenna impedance, generate an error signal related to a characteristic of the out-of-band antenna impedance, apply the error signal to a controller circuit configurable to generate a signal representing the change in impedance of the antenna, and apply the impedance error signal to the selectively adjustable impedance. In some embodiments the antenna signal originates from a source outside of the wireless communication device, such as a Global Positioning System (GPS) satellite, while in other embodiments the antenna signal comprises a portion of a signal applied to the antenna by a transmitter of the wireless communication device.

Figure 1:
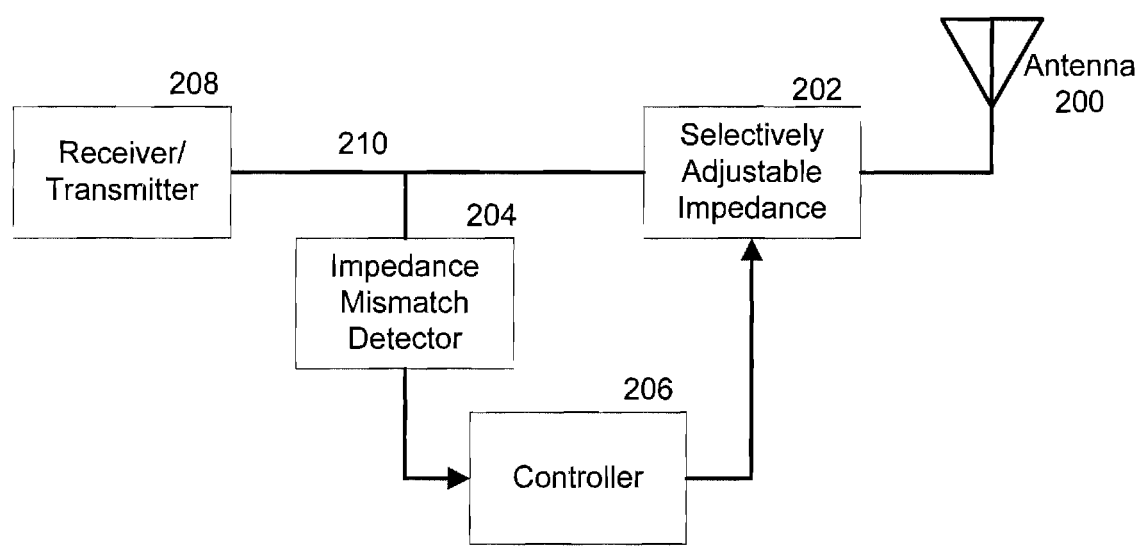
FIG. 1 shows a block diagram of a system for compensating for the effects of a user's hand on the performance of an antenna.

FIG. 1 provides a block diagram of a receiver/transmitter system with circuitry for tuning the resonant frequency of an antenna to compensate for user proximity effects. The system comprises an antenna 200 connected to a selectively adjustable impedance 202. Antenna 200 is also connected to transmitter/receiver 208 via antenna signal 210, which may comprise radio-frequency signals provided to antenna 200 for transmission and radio-frequency signals originating from outside the system that were captured by antenna 200. Antenna 200 may be connected directly to transmitter/receiver 208 or through intermediate components, as known by those skilled in the art. Antenna signal 210 is also provided to impedance mismatch detector 204 which estimates the deviation of the current antenna impedance from the desired 50 ohms. Based on this estimate, controller 206 adjusts selectively adjustable impedance 202 in order to correct the resonant frequency of the antenna to the desired resonant frequency.

Figure 2:
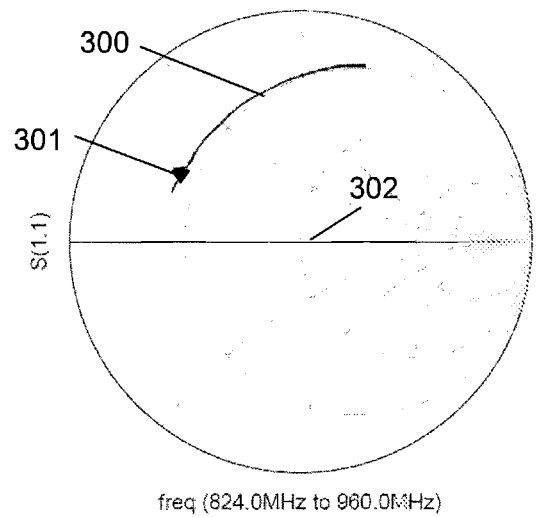
FIG. 2 is a Smith chart illustrating the effects of a user's hand on the impedance of an exemplary antenna in the 800-MHz frequency band.

FIG. 2 provides a graphical illustration of the effect of user proximity on antenna performance. FIG. 2 is a Smith chart, familiar to those skilled in the art, showing the impedance of an exemplary antenna in a wireless communication device over a frequency range of 824.0 MHz to 960.0 MHz, portions of which are normally used for cellular communications. Ideally, the impedance of the antenna is 50 ohms across the entire frequency range of interest, which is illustrated by point 302 on the real axis of the graph. When the user holds the wireless communication device, the antenna impedance tends to become more capacitive which is illustrated by curve 300 in FIG. 2, which is above the real axis. The left- and right-most ends of curve 300 are the antenna impedance at 824.0 and 960.0 MHz, respectively, while point 301 is the impedance at an exemplary frequency of 830 MHz. As its impedance becomes more capacitive due to the user proximity, the antenna's resonant frequency shifts from a desired frequency to a lower frequency, which causes the reduced performance at the desired frequency as discussed previously.

Figure 3:
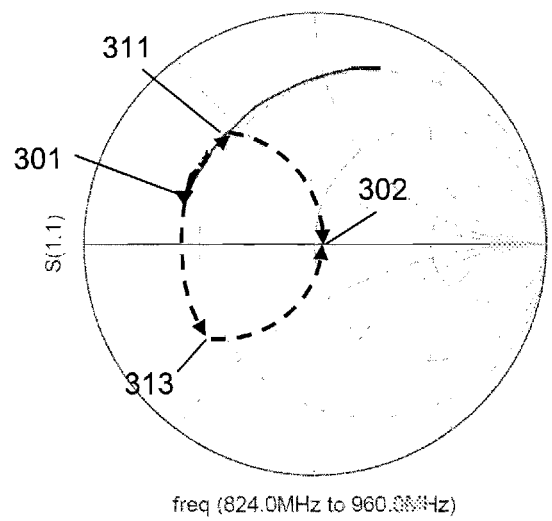
FIG. 3 is a Smith chart illustrating two different approaches for compensating for the effects of a user's hand on the impedance of the exemplary antenna.

FIG. 3 illustrates two possible ways of compensating for the capacitive effects of the user proximity in order to shift the impedance back to the desired 50 ohms and, consequently, the resonant frequency back to the desired frequency. In one approach the impedance matching network comprises an inductance in series between the antenna feed point and the radio frequency circuits and a shunt capacitance to ground. As illustrated in FIG. 3, the series inductance shifts the antenna impedance at 830 MHz from point 301 to point 311, while the shunt capacitance shifts the antenna impedance from point 311 to point 302, the desired 50 ohms. Alternately, the impedance matching network comprises a capacitance in series between the antenna feed point and the radio frequency circuits and a shunt inductance to ground. As illustrated in FIG. 3, the series capacitance shifts the antenna impedance at 830 MHz from point 301 to point 313, while the shunt inductance shifts the antenna impedance from point 311 to the desired point 302. In each of these approaches illustrated in FIG. 3, particular inductance and capacitance values were chosen to effect the desired impedance change to from point 301 to point 302 at 830 MHz. Given the antenna impedance with user proximity varies considerably with frequency as illustrated by curve 300, preferably both inductance and capacitance are adjustable, which increases the complexity of the matching network.

Figure 4A:
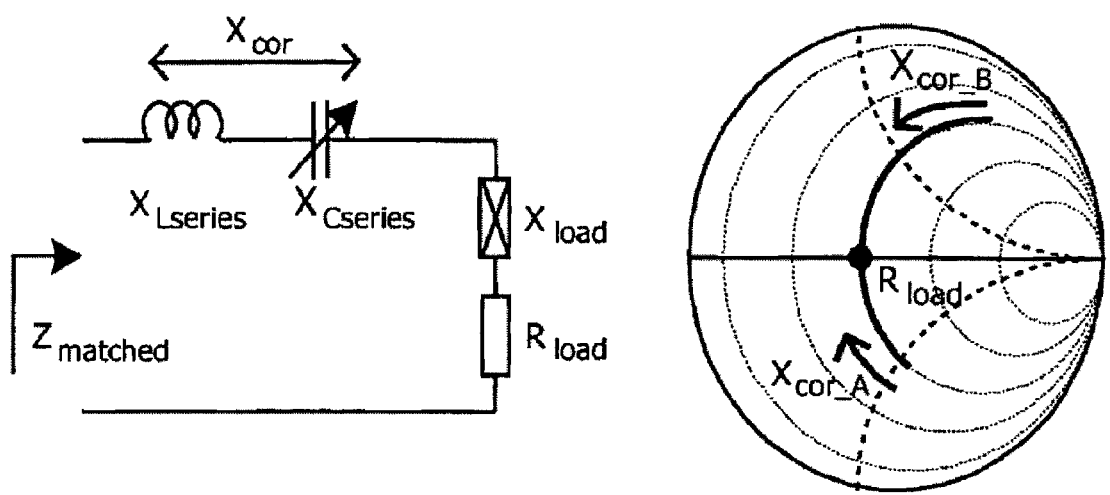
FIGS. 4a, 4b, and 4c show prior art solutions for compensating for the effects of a user's hand on the performance of an antenna.

FIG. 4a illustrates one prior art solution for adjustably matching the impedance of an antenna, as further disclosed and described in U.S. Patent Appl. Pub. 2009/0302968A1 by A. Van Beezoijen. In this solution, an impedance matching network $X_{cor}$ comprising a fixed reactance, $X_{Lseries}$, and a tunable capacitance, $X_{Cseries}$, are placed in series between the antenna feed point and the radio-frequency transmitter and/or receiver circuits in the wireless device. By adjusting the tunable capacitance, $X_{Cseries}$, the total matched impedance, $Z_{matched}$, of the antenna is shifted to the desired impedance $R_{load}$, which in most cases is 50 ohms. By using a single adjustable component placed in series with the antenna feed point, however, the solution of FIG. 4a may not be able to compensate for the complex effects of user proximity on antenna performance, as illustrated in FIGS. 2a and 2b.

Figure 4B:
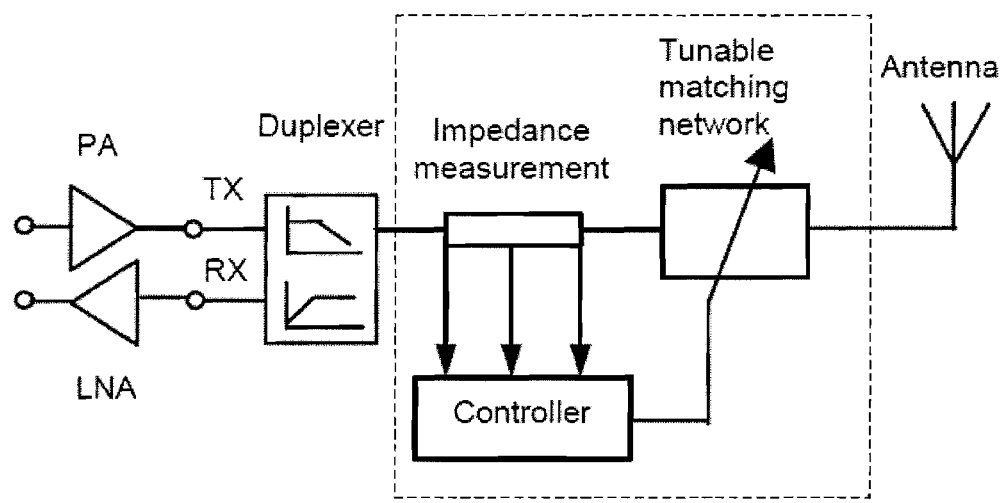
Figure 4C:
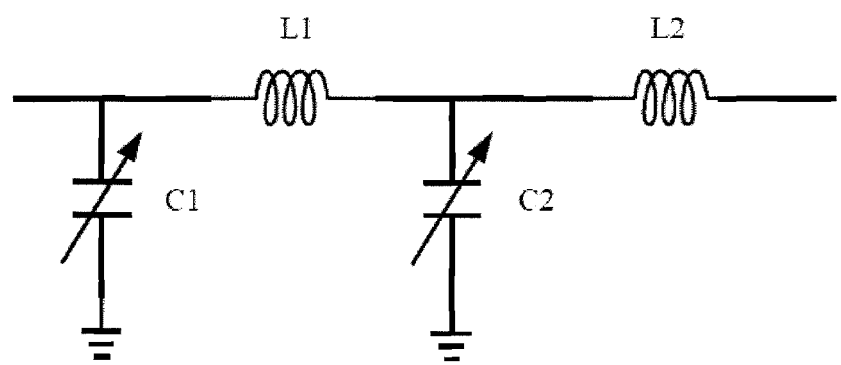

FIGS. 4b and 4c illustrate another prior art solution for compensating for the effects of user proximity on antenna performance, as further disclosed and described in "Antenna Impedance Mismatch Measurement and Correction for Adaptive CDMA Transceivers" by D. Qiao, et al., published by the IEEE. As shown in FIG. 4b, a tunable impedance matching network is placed in series between the antenna feed point and the radio-frequency transmitter circuit in the wireless device. As shown in FIG. 4c, the tunable impedance matching network comprises two fixed series reactances, $L_1$ and $L_2$, and two tunable shunt capacitances, $C_1$ and $C_2$. Each of the tunable capacitances $C_1$ and $C_2$ comprise a combination of parallel capacitances that are selectively switched on and off using silicon-on-sapphire switches. In addition to the complex impedance matching network shown in FIG. 4c, implementations of this solution typically require both a three-point measurement of the antenna impedance along a quarter-wavelength transmission line and for the transmitter to be operational.

Figure 5:
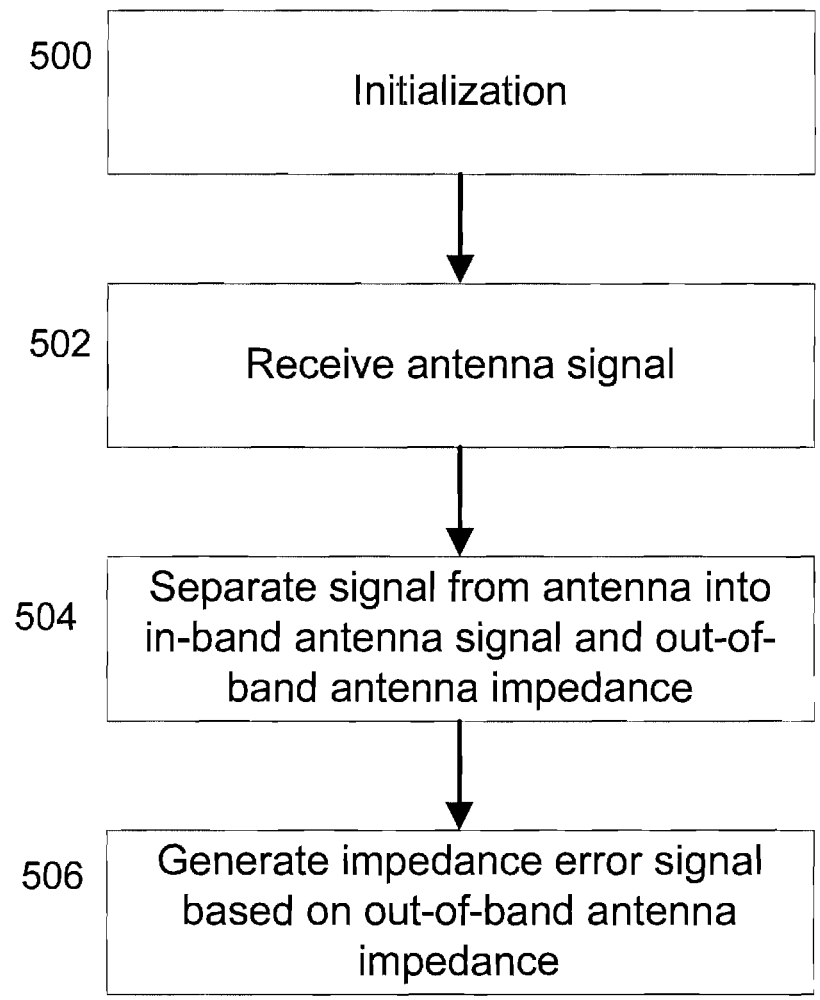
FIG. 5 shows the steps of a method for determining the change in impedance of an antenna in a wireless communication device in accordance with certain embodiments of the present disclosure.

FIG. 5 illustrates a method for determining the change in impedance of an antenna in a wireless communication device in accordance with certain embodiments of the present disclosure. Each of the steps of the process shown in FIG. 5 may be implemented by various combinations of hardware and software, some of which may include a software-programmable processor. In step 500, any necessarily initialization of hardware components used in the process is performed. This step may include, for example, loading software code into a processor for implementing one or more further steps of the process. This step also may include initializing contents of registers used in other programmable hardware, such as controllers, oscillators, counters, and other devices known to those skilled in the art.

In step 502, an antenna signal is received in the wireless communication device. In some embodiments, the antenna signal may comprise a signal originating from a source outside of the wireless communication device that is received by the antenna, such as a Global Positioning System (GPS)

signal, while in other embodiments the antenna signal may comprise a signal applied to the antenna by a transmitter of the wireless communication device. In step 504, the antenna signal is separated into an in-band antenna signal and an out-of-band antenna impedance. In some embodiments, the separation may be performed by a filter such as a diplexer. In step 506, an impedance error signal related to the out-of-band antenna impedance is generated. In some embodiments, step 506 further comprises applying the out-of-band antenna impedance to an oscillator, which generates a frequency error signal based upon the out-of-band antenna impedance. In such embodiments, step 506 further comprises applying the frequency error signal to a controller that generates an impedance error signal representing the change in impedance of the antenna.

Figure 6:
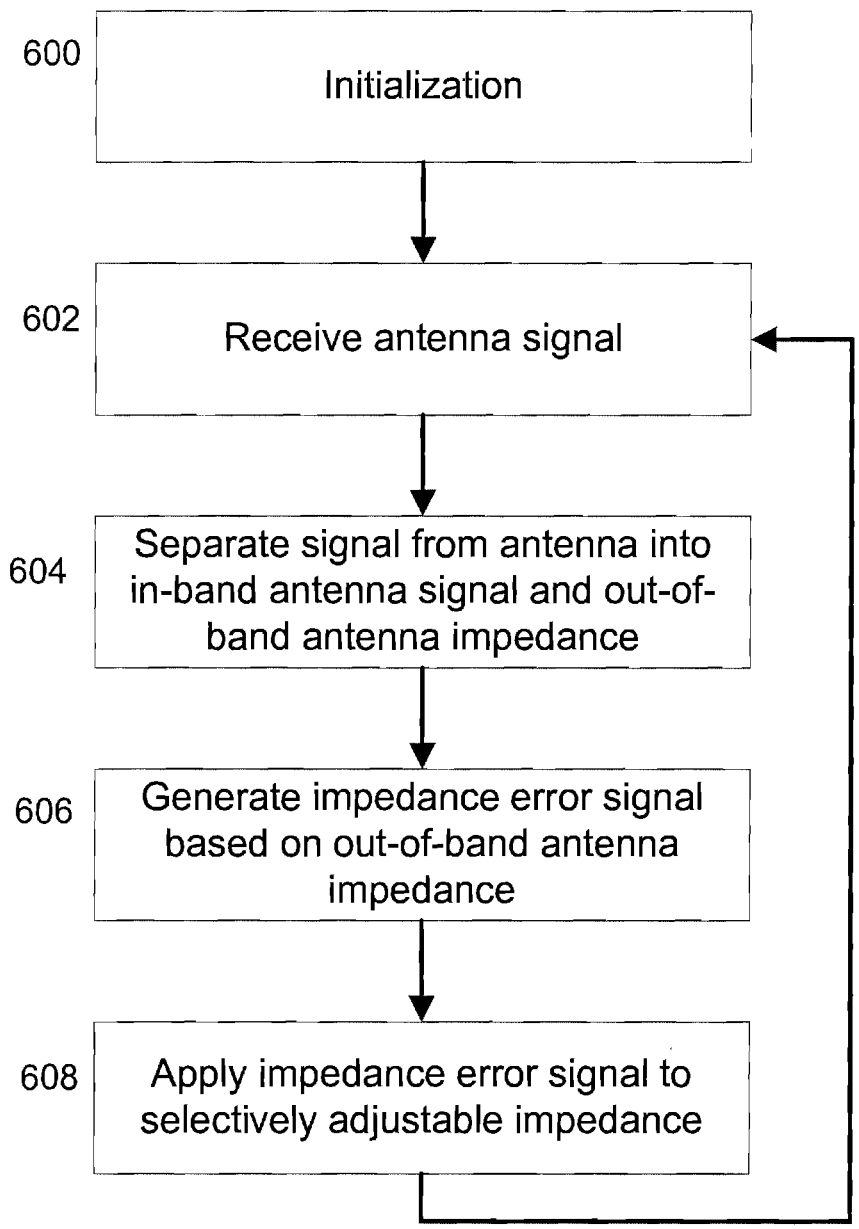
FIG. 6 shows a method for tuning the resonant frequency of an antenna in a wireless communication device in accordance with certain embodiments of the present disclosure.

FIG. 6 illustrates further embodiments of the present disclosure, namely a method for tuning the resonant frequency of an antenna in a wireless communication device using a selectively adjustable impedance disposed between the antenna element and a ground plane of the wireless communication device. Each of the steps of the process shown in FIG. 6 may be implemented by various combinations of hardware and software, some of which may include a software-programmable processor. In step 600, any necessarily initialization of hardware components used in the process is performed. This step may include, for example, loading software code into a processor for implementing one or more further steps of the process. This step also may include initializing contents of registers used in other programmable hardware, such as controllers, oscillators, dividers, and other devices known to those skilled in the art.

In step 602, an antenna signal is received in the wireless communication device. In some embodiments, the antenna signal may comprise a signal originating from a source outside of the wireless communication device that is received by the antenna, such as a Global Positioning System (GPS) signal, while in other embodiments the antenna signal may comprise a signal applied to the antenna by a transmitter of the wireless communication device. In step 604, the antenna signal is separated into an in-band antenna signal and an out-of-band antenna impedance. In some embodiments, the separation may be performed by a filter such as a diplexer. In step 606, an impedance error signal related to the out-of-band antenna impedance is generated. In some embodiments, step 606 further comprises applying the out-of-band antenna impedance to an oscillator, which generates a frequency error signal based upon the out-of-band antenna impedance. In such embodiments, step 606 further comprises applying the frequency error signal to a controller that generates an impedance error signal representing the change in impedance of the antenna. In step 608, the impedance error signal is applied to the selective adjustable impedance disposed between the antenna element and a ground plane of the wireless communication device in a manner that adjusts the resonant frequency of the antenna toward a desired resonant frequency. As shown in FIG. 6, steps 602 through 608 may be repeated as necessary until the resonant frequency of the antenna is within an acceptable range of the desired resonant frequency.

Figure 7:
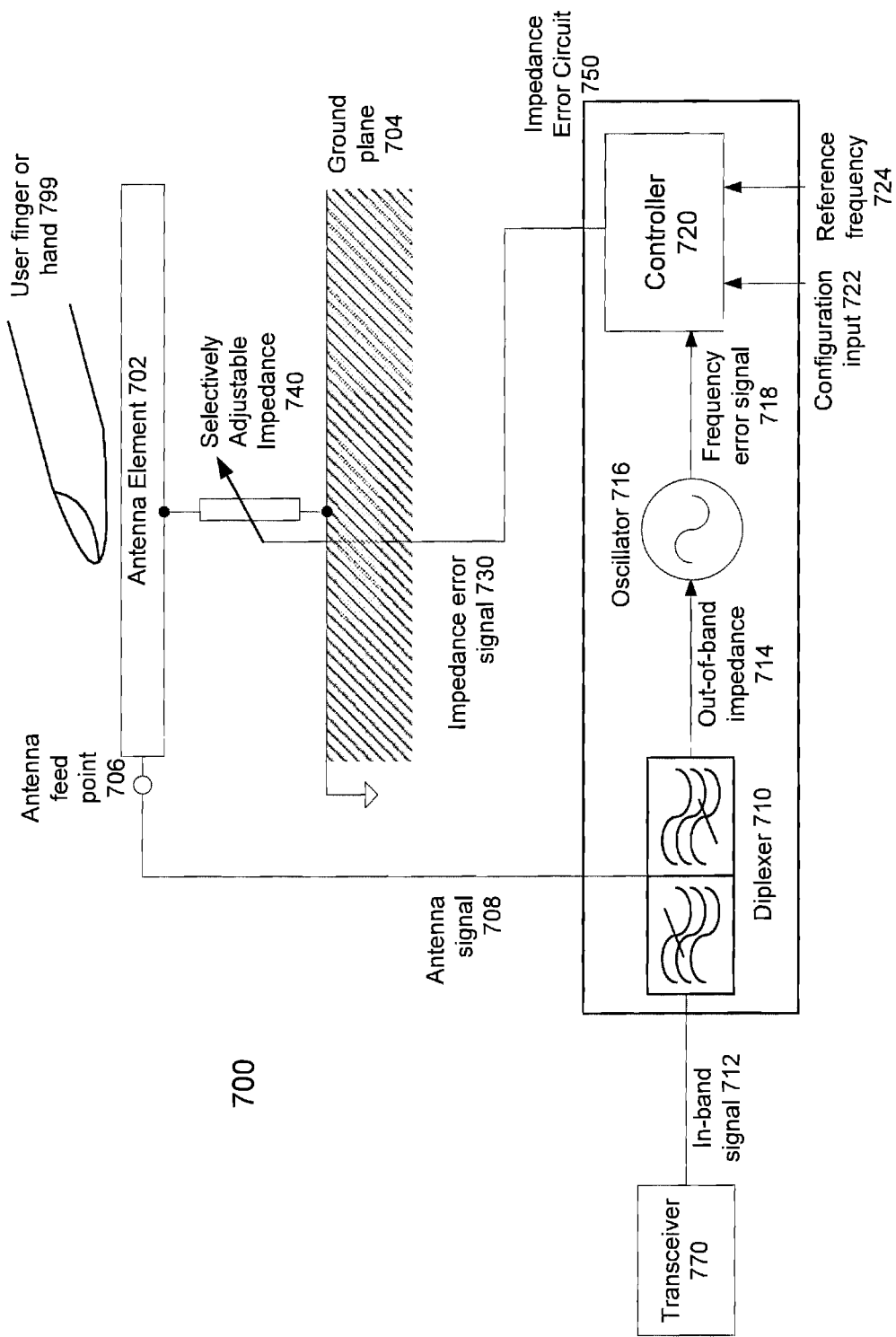
FIG. 7 shows a block diagram of a radio-frequency section of a wireless communication device utilizing certain embodiments of the present disclosure.

FIG. 7 shows a block diagram of a radio-frequency section 700 of a wireless communication device utilizing certain embodiments of the present disclosure, including the methods described above with reference to FIGS. 5 and 6. Radio-frequency section 700 includes an antenna comprising an antenna element 702 and an antenna feed point 706. Disposed between antenna element 702 and a ground plane 704 is selectively adjustable impedance 740, such as a variable reactance ("varactor"). In some embodiments, selectively adjustable impedance 740 is disposed as close as possible to the location(s) where user finger or hand 700 comes into proximity with antenna element 702. In some embodiments, selectively adjustable impedance 740 is disposed substantially away from antenna feed point 706. Antenna signal 708 is operably connected from antenna feed point 706 to impedance error circuit 750.

Figure 8:
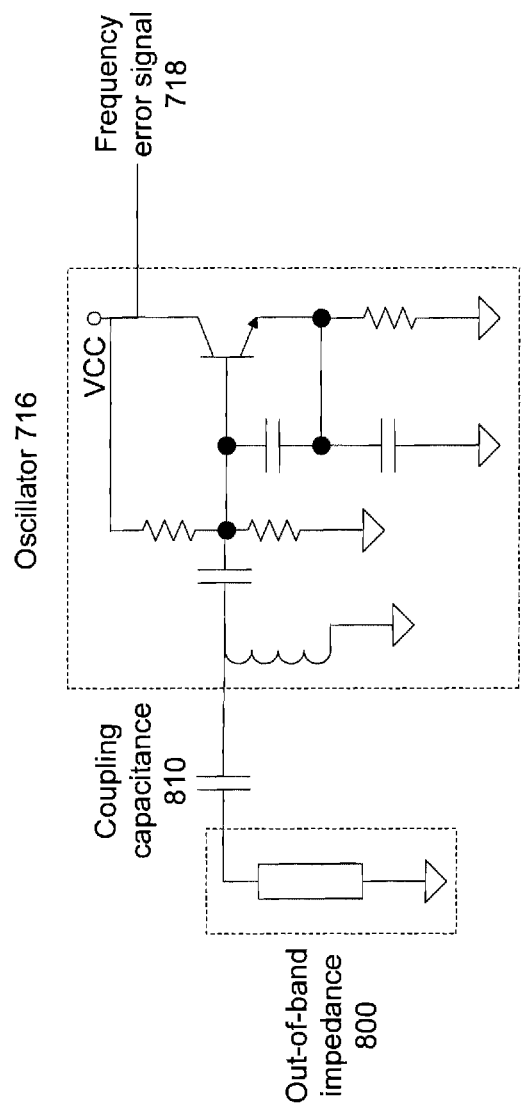
FIG. 8 shows an exemplary oscillator circuit used in certain embodiments of the present disclosure.

In some embodiments, impedance error circuit 750 comprises diplexer 710 that separates antenna signal 706 into in-band signal 712, which is connected to transceiver 770, and out-of-band impedance 714 that is provided to oscillator 716. In effect, diplexer 710 couples the out-of-band impedance of the antenna to oscillator 716. This is shown in FIG. 8, which illustrates a radio-frequency tank oscillator that is one embodiment of oscillator 716 comprised within impedance error circuit 750. As shown in FIG. 8, out-of-band impedance 800 of the antenna is operably coupled to the input of oscillator 716 through a small coupling capacitance that may be disposed between oscillator 716 and diplexer 710. By this coupling, out-of-band impedance affects the resonant frequency of oscillator 716, such that frequency error signal 718 changes in relation to a change in out-of-band impedance 800. This coupling effect may be exploited in embodiments of impedance error circuit 750 that use different types of oscillators, such as variable-frequency crystal oscillators.

Returning to FIG. 7, some embodiments of impedance error circuit 750 also comprise a controller 720 that receives frequency error signal 718 as an input and generates an impedance error signal 730 as an output. In some embodiments, controller 720 receives a configuration input 722, such as from a software-programmable processor, which may include settings for registers or other circuits used to determine the relationship between frequency error signal 716 and impedance error signal 730. In some embodiments, controller 720 receives a reference frequency 724, which may be related to the desired resonant frequency of the antenna. In some embodiments, controller 720 may be a phase-locked-loop (PLL) comparator circuit. Controller 720 of impedance error circuit 750 applies impedance error signal 730 to selectively adjustable impedance 740 in a manner that adjusts the resonant frequency of the antenna toward a desired resonant frequency. This may be done continuously while transceiver 770 is operational in receiver and/or transmit modes, or as necessary until the resonant frequency of the antenna is within an acceptable range of the desired resonant frequency.

Figure 9:
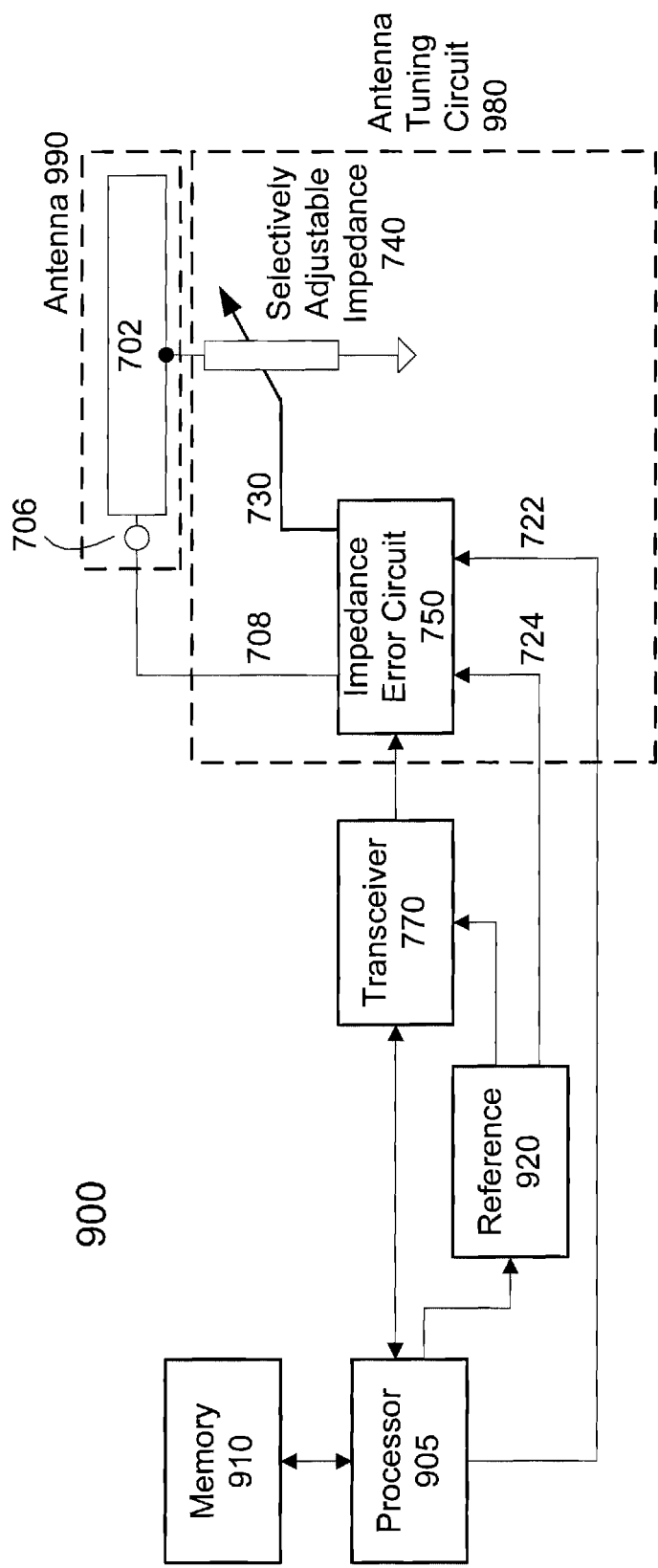
FIG. 9 shows a wireless communication device in accordance with certain embodiments of the present disclosure.

FIG. 9 shows a block diagram of a wireless communication device utilizing certain embodiments of the present disclosure, including one or more of the methods described above with reference to FIGS. 5 and 6 and/or the circuits described above with reference to FIGS. 7 and 8. Wireless communication device 900 comprises processor 905 which is operably connected to memory 910 via parallel address and data buses, serial ports, or other methods known to those of ordinary skill in the art. Memory 910 comprises software code executed by processor 905 to control the functions of wireless communication device 900, including configuring and controlling various components (e.g., antenna tuning circuit 980 via configuration signal 722), receiving and, in some embodiments, transmitting data via transceiver 770. Memory 910 also may comprise a data memory area for processor 905 to store variables used in configuration, control, and other functions. As such, memory 910 may comprise non-volatile memory (e.g., flash memory), volatile memory (e.g., static or dynamic RAM), or a combination thereof. Persons of ordinary skill in the art will recognize that processor 905 may comprise multiple individual processors 905a, 905b, etc. (not shown), each of which implements a portion of the functionality described above. In such case, multiple individual processors 905a, 905b, etc. may be commonly connected to memory 910 or individually connected to multiple individual memories 910a, 910b, etc., respectively (not shown).

Wireless communication device 900 also comprises an antenna 990, which includes antenna element 702 and antenna feed point 706, and antenna tuning circuit 980. Antenna tuning circuit 980 further comprises impedance error circuit 750 and selectively adjustable impedance 740 disposed between antenna element 702 and ground plane 704. Embodiments of impedance error circuit 750 and selectively adjustable impedance 740 are described above with reference to FIG. 7. In accordance with certain embodiments of the disclosure, antenna tuning circuit 980 receives antenna signal 708 and processes it to generate impedance error signal 730 that it applies to selectively adjustable impedance 740 in order to adjust the resonant frequency of antenna 990 toward a desired resonant frequency.

Wireless communication device 900 also includes reference oscillator 920 that provides a frequency reference related to the desired receive and/or transmit frequency to various components including transceiver 780 and antenna tuning circuit 980. In some embodiments, reference 920 may be used by antenna tuning circuit 980 to generate impedance error signal 730. The frequency of reference 920 may be adjusted or configured by processor 905.

In some embodiments, wireless communication device 900 may comprise more functionality than is shown in FIG. 9. In some embodiments, wireless communication device 900 may be a "smartphone" comprising a touch-screen display, a video and/or still-image camera, and multiple radio-frequency communication standards including GSM, GPRS, EDGE, Wideband CDMA/UMTS, CDMA2000, LTE, WiFi, Bluetooth, GPS, and/or others. Persons of ordinary skill in the art will recognize the above list of features and radio-frequency communication standards is merely exemplary and not limiting to the scope of the present disclosure. Accordingly, processor 905 may execute software code stored in memory 910 to control such functionality. In some embodiments, processor 905 may comprise multiple individual processors 905a, 905b, etc. which may execute software code stored in multiple individual memories 910a, 910b, etc.

Figure 10A:
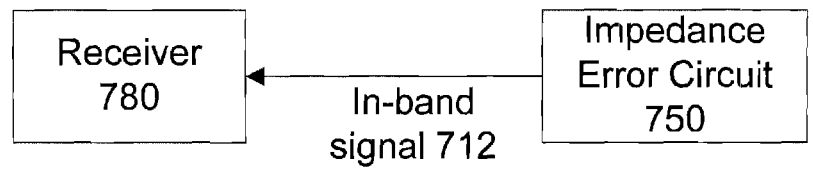
FIGS. 10a, 10b, and 10c show different embodiments of a radio-frequency transceiver used in various embodiments of the present disclosure.
Figure 10B:
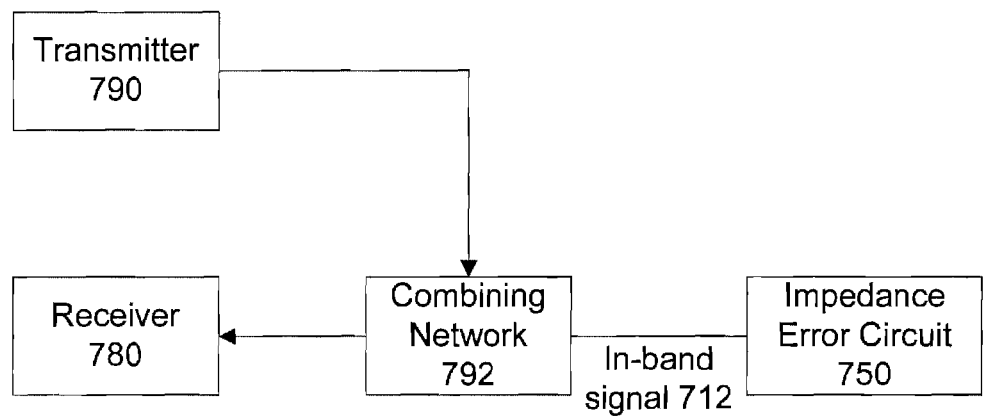

Transceiver 770 shown in FIGS. 7 and 9 may take various forms depending on the number and variety of radio-frequency communication standards present in wireless communication device 900. FIG. 10a illustrates an embodiment in which transceiver 770 comprises a receiver 780 that is connected to impedance error circuit 750. This embodiment may be employed, for example, when antenna 790 is used for a single receive-only radio frequency communication standard such as GPS. FIG. 10b illustrates an alternate embodiment in which transceiver 770 comprises a transmitter 790 and a receiver 780 which share the use of antenna 790 and are operably connected to impedance error circuit 750 via combining network 792. Combining network 792 may comprise a duplexer, a transmit/receive switch, or other circuits known to persons skilled in the art. The embodiment of FIG. 10b may be employed, for example, with duplex communication standards such as cellular, Bluetooth, WiFi, etc. In such embodiments, the methods of FIGS. 5 and 6 may be utilized when receiver 780 and/or transmitter 790 are operational.

Figure 10C:
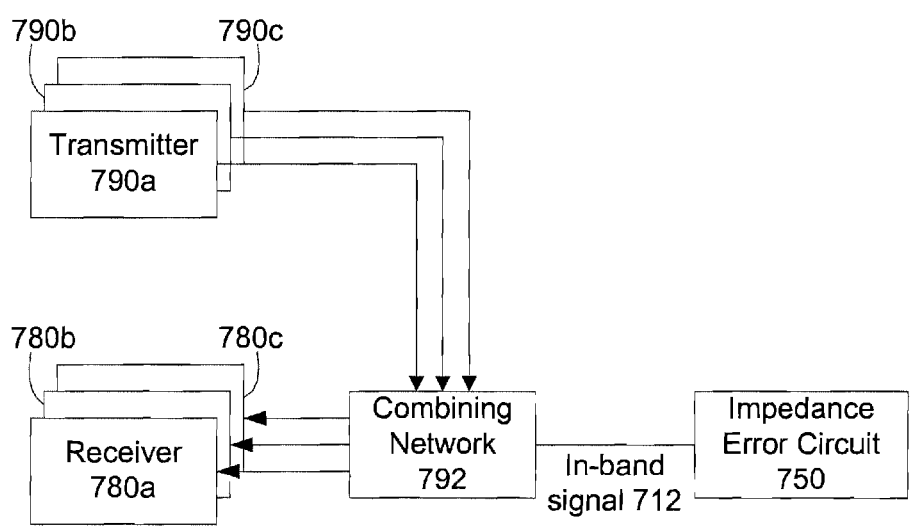

Certain methods and circuits of the present disclosure also may be utilized in cases where a plurality of the multiple radio-frequency communication standards present in wireless communication device 900 share a single antenna 990. In such embodiments, transceiver 770 of FIGS. 7 and 9 may take the form shown in FIG. 10c, where a plurality of receivers 780a, 780b, and 780c and/or a plurality of transmitters 790a, 790b, and 790c are operably connected to common impedance error circuit 750 via combining network 792. Persons of ordinary skill in the art will recognize that the number of receivers and transmitters shown in FIG. 10c are merely exemplary and are not limited by the present disclosure. Antenna tuning circuit 980 may be configured by processor 905 based on the particular radio-frequency communication standard operational at any given time. Configuration values for each of the respective radio-frequency standards that share antenna tuning circuit 980 may be stored in and retrieved from memory 910 by processor 905 as needed.

In addition, wireless communication device 900 may utilize combinations of embodiments described above with reference to FIGS. 5 through 10. Wireless communication device 900 may contain multiple antennas 990a, 990b, etc. (not shown), which are coupled to antenna tuning circuits 980a, 980b, etc. (not shown), respectively. For example, receive-only standards (e.g., GPS) may utilize antenna 990a and antenna tuning circuit 980a (comprising impedance error circuit 750a), while duplex standards (e.g., cellular, Bluetooth, WiFi) may utilize antenna 990b and antenna tuning circuit 980b (comprising impedance error circuit 750b). A person of ordinary skill in the art will appreciate that other combinations of radio-frequency communication standards, antennas, and antenna tuning circuits are possible according to embodiments of the present disclosure.

Moreover, the terms and descriptions used herein are set forth by way of illustration only and are not meant as limitations. Those skilled in the art will recognize that many variations are possible within the spirit and scope of the disclosure as defined in the following claims, and their equivalents, in which all terms are to be understood in their broadest possible sense unless otherwise indicated.

What is claimed is:

1. A method for tuning the resonant frequency of an antenna in a wireless communication device, comprising the steps of:
   sensing the out-of-band impedance of the antenna, the antenna comprising an antenna element and a selectively adjustable impedance disposed between the antenna element and a ground plane of the wireless device; and
   adjusting the selectively adjustable impedance to achieve a desired resonant frequency of the antenna, wherein the sensing step further comprises:
   separating an antenna signal into an in-band antenna signal and the out-of-band antenna impedance;
   generating an error signal related to the out-of-band impedance; and
   applying the error signal to a controller circuit configurable to generate an impedance error signal.

2. The method of claim 1 wherein the antenna signal comprises a signal originating from a source outside of the wireless device that is received by the antenna.

3. The method of claim 1 wherein the antenna signal comprises a portion of a signal applied to the antenna by a transmitter of the wireless device.

4. The method of claim 1 wherein:
   the generating step further comprises applying the out-of-band antenna impedance to an oscillator; and
   the error signal is a frequency error signal.

5. The method of claim 1 wherein the applying step further comprises applying the impedance error signal to the selectively adjustable impedance.

6. The method of claim 1 wherein the out-of-band impedance comprises the combination of the actual load impedance of the antenna and the selectively adjustable impedance.

7. The method of claim 1 wherein the selectively adjustable impedance is a variable reactance.

8. The method of claim 1 wherein the selectively adjustable impedance is disposed substantially away from the feed point of the antenna.

9. The method of claim 1 wherein the desired resonant frequency is a frequency on which Global Positioning System (GPS) signals are transmitted.

10. The method of claim 1 wherein the desired resonant frequency is a frequency used during two-way wireless communications.

11. A method for determining the change in impedance of an antenna in a wireless communication device, comprising the steps of:
   separating an antenna signal into an in-band antenna signal and an out-of-band antenna impedance;
   generating an error signal related to the out-of-band antenna impedance; and
   applying the error signal to a controller circuit configurable to generate a signal representing the change in impedance of the antenna.

12. The method of claim 11 wherein the antenna signal comprises a signal originating from a source outside of the wireless communication device that is received by the antenna.

13. The method of claim 11 wherein the antenna signal comprises a portion of a signal applied to the antenna by a transmitter of the wireless communication device.

14. The method of claim 11 wherein:
   the generating step further comprises applying the out-of-band antenna impedance to an oscillator; and
   the error signal is a frequency error signal.

15. An electronic circuit for determining the change in impedance of an antenna in a wireless communication device, comprising:
   a filter operably connected to the antenna, wherein the filter comprises a diplexer that separates an antenna signal into an in-band antenna signal and an out-of-band antenna impedance;
   an oscillator operably connected to the filter, said oscillator capable of generating a frequency error signal related to the out-of-band antenna impedance; and
   a controller operably connected to the oscillator, said controller configurable to generate a signal related to the change in impedance of the antenna in proportion to the frequency error signal.

16. The electronic circuit of claim 15 wherein the out-of-band antenna impedance comprises the combination of the actual antenna load impedance and a selectively adjustable impedance.

17. The electronic circuit of claim 15 wherein the oscillator comprises a radio frequency (RF) crystal oscillator.

18. The electronic circuit of claim 15 wherein the oscillator comprises a radio frequency (RF) tank oscillator.

19. A wireless communication device comprising:
   an antenna; and
   an antenna tuning circuit, comprising:
      a selectively adjustable impedance disposed between an element of the antenna and a ground plane of the wireless communication device;
      a filter operably connected to the antenna, wherein the filter comprises a diplexer that separates an antenna signal into an in-band antenna signal and an out-of-band antenna impedance;
      an oscillator operably connected to the filter, said oscillator capable of generating a frequency error signal related to the out-of-band antenna impedance; and
      a controller operably connected to the oscillator, said controller configurable to generate an impedance error signal in proportion to the frequency error signal and to adjust the resonant frequency of the antenna to a desired resonant frequency by applying the impedance error signal to the selectively adjustable impedance.

20. The wireless communication device of claim 19 wherein the antenna signal comprises a signal originating from a source outside of the wireless device that is received by the antenna.

21. The wireless communication device of claim 19 further comprising a wireless communication transmitter, wherein the antenna signal comprises a portion of a signal applied to the antenna by the wireless communication transmitter.

22. The wireless communication device of claim 19 wherein the selectively adjustable impedance is a variable reactance.

23. The wireless communication device of claim 19 wherein the selectively adjustable impedance is disposed substantially away from the feed point of the antenna.

24. The wireless communication device of claim 19, further comprising a Global Positioning System (GPS) receiver, and wherein the desired resonant frequency is a frequency on which Global Positioning System (GPS) signals are transmitted.

25. The wireless communication device of claim 19, further comprising a wireless transceiver, and wherein the desired resonant frequency is a frequency used during two-way wireless communications.

26. The wireless communication device of claim 19, wherein the out-of-band antenna impedance comprises the combination of the actual antenna load impedance and a selectively adjustable impedance.

* * * * *